(12) United States Patent
Yu

(10) Patent No.: US 11,381,720 B2
(45) Date of Patent: Jul. 5, 2022

(54) CAMERA MODULE AND ELECTRONIC DEVICE

(71) Applicant: TRIPLE WIN TECHNOLOGY(SHENZHEN) CO. LTD., Shenzhen (CN)

(72) Inventor: Fei-Fan Yu, Shenzhen (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 11 days.

(21) Appl. No.: 16/925,689

(22) Filed: Jul. 10, 2020

(65) Prior Publication Data

US 2021/0385361 A1 Dec. 9, 2021

(30) Foreign Application Priority Data

Jun. 4, 2020 (CN) .......................... 202010499672.7

(51) Int. Cl.
*H04N 5/225* (2006.01)
*H04N 5/232* (2006.01)

(52) U.S. Cl.
CPC ......... *H04N 5/2254* (2013.01); *H04N 5/2252* (2013.01); *H04N 5/23227* (2018.08); *H04N 5/2257* (2013.01)

(58) Field of Classification Search
CPC ............. H04N 5/2254; H04N 5/23227; H04N 5/2252; H04N 5/2257
See application file for complete search history.

(56) References Cited

U.S. PATENT DOCUMENTS

2017/0353640 A1* 12/2017 Wang ................ H01L 27/14618

FOREIGN PATENT DOCUMENTS

CN  104954651 A  9/2015

* cited by examiner

*Primary Examiner* — Timothy J Henn
*Assistant Examiner* — Fayez A Bhuiyan
(74) *Attorney, Agent, or Firm* — ScienBiziP, P.C.

(57) ABSTRACT

A camera module includes a substrate, a number of sensors, and a film. The substrate defines a receiving cavity. The receiving cavity includes a bottom portion. The bottom portion defines an opening. The sensors are mounted around the opening. The film is attached to the substrate and covers the receiving cavity. The camera module defines a channel communicating with the receiving cavity.

18 Claims, 6 Drawing Sheets

CAMERA MODULE AND ELECTRONIC DEVICE

FIELD

The subject matter herein generally relates to electronic devices, and more particularly to a camera module for an electronic device.

BACKGROUND

More and more electronic products have integrated circuits directly bonded to an ACF (anisotropic conductive film). In the related art, a substrate of the electronic product easily generates gas in high temperature, high pressure, or other harsh environments, and the generated gas cannot be discharged, so that bubbles may be generated between the substrate and the ACF, thereby affecting the use of the product.

BRIEF DESCRIPTION OF THE DRAWINGS

Implementations of the present disclosure will now be described, by way of embodiments, with reference to the attached figures.

DETAILED DESCRIPTION

Figure 1:
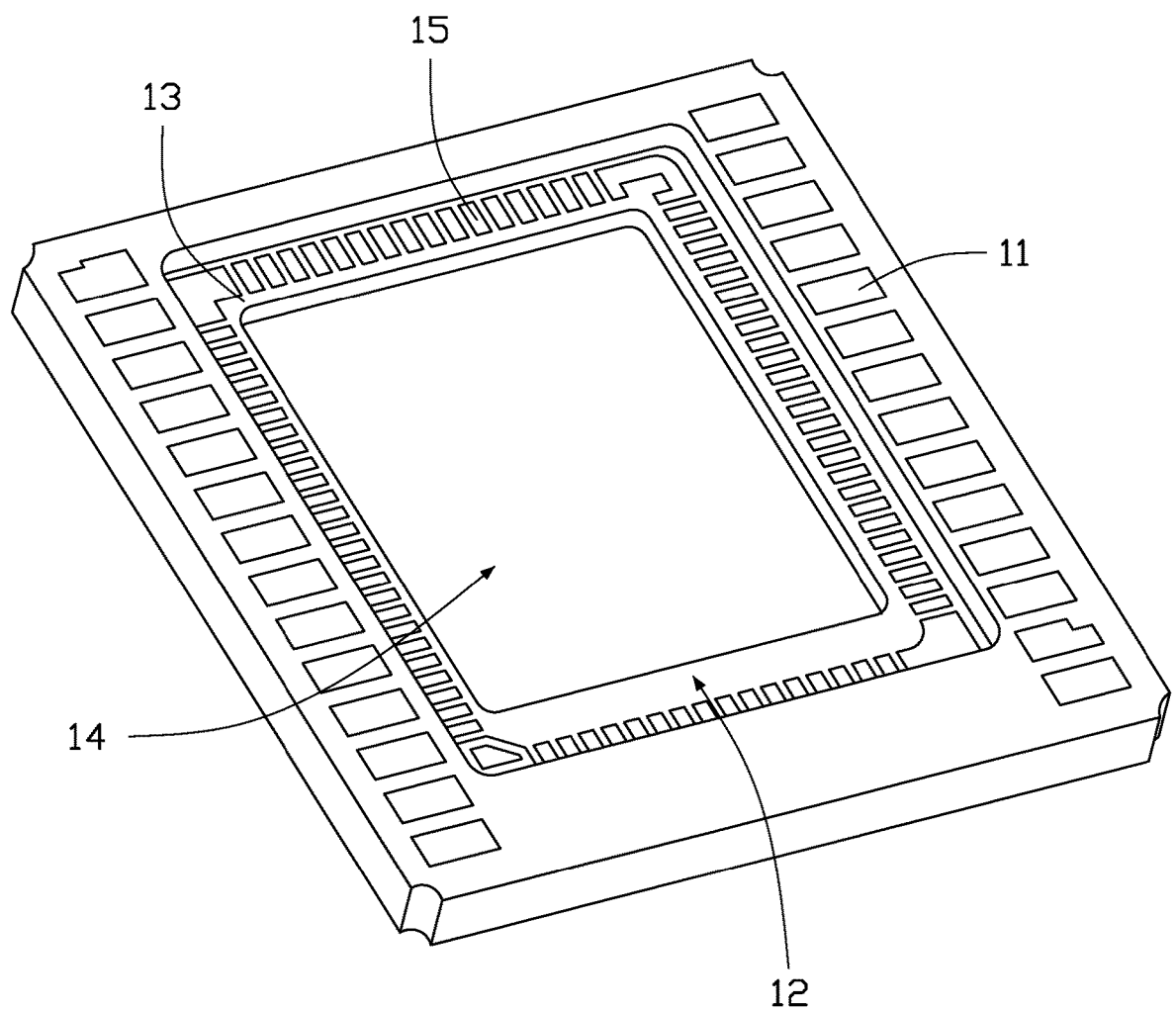
FIG. 1 is a schematic perspective view of an embodiment of a substrate of a camera module.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "comprising" means "including, but not necessarily limited to"; it specifically indicates open-ended inclusion or membership in a so-described combination, group, series and the like.

Figure 2:
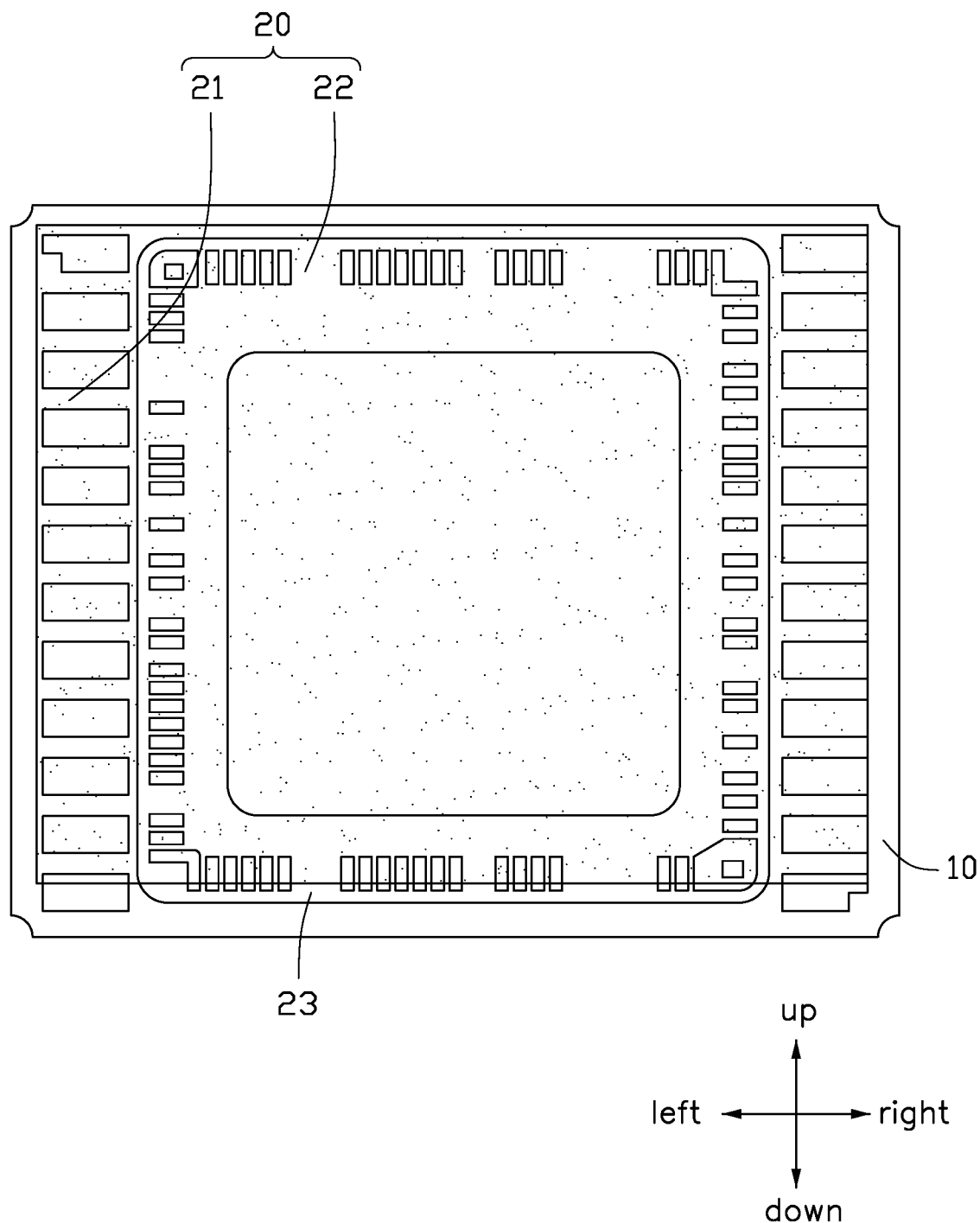
FIG. 2 is a schematic diagram of a camera module.

Referring to FIGS. 1-2, an embodiment of a camera module 100 includes a substrate 10 and a film 20. The substrate 10 defines a receiving cavity 12. The receiving cavity 12 includes a bottom portion 13, and the bottom portion 13 defines an opening 14. A plurality of sensors 15 is provided around the opening 14, and the film 20 is attached to the substrate 10 to cover the receiving cavity 12. The camera module 100 further defines a channel 23 to allow gas in the receiving cavity 12 to be discharged toward the film 20.

The camera module 100 provided above defines the receiving cavity 12 in the substrate 10, and the channel 23 communicates with the receiving cavity 12 so that the gas in the receiving cavity 12 is discharged through the channel 23 to improve reliability of the camera module 100.

Referring to FIG. 1, spacers 11 are provided on opposite sides of the substrate 10 for attaching the film 20. In one embodiment, the film 20 is attached to the substrate 10 by an indenter (not shown) to press the film 20 on the spacers 11. It should be noted that the above-mentioned indenter only presses the opposite sides of the film 20 on the spacers 11.

The receiving cavity 12 is defined in a middle of the substrate 10.

The sensors 15 are mounted on the bottom portion 13 in the receiving cavity 12. In one embodiment, the bottom portion 13 surrounds an inner wall of the receiving cavity 12.

The opening 14 is defined in a middle of the bottom portion 13 and communicates with the receiving cavity 12 to allow external light to enter the camera module 100 through the opening 14.

The sensors 15 are used for detecting external ambient light and transmitting a detected ambient light signal to a processor (not shown). In one embodiment, the sensors 15 uniformly surround the bottom portion 13. It can be understood that the arrangement of the sensors 15 is not limited. In other embodiments, the sensors 15 may be randomly distributed on the bottom portion 13. For example, the sensors 15 may be disposed at four corners of the bottom portion 13 or at midpoints of four sides of the bottom portion 13.

Figure 3:
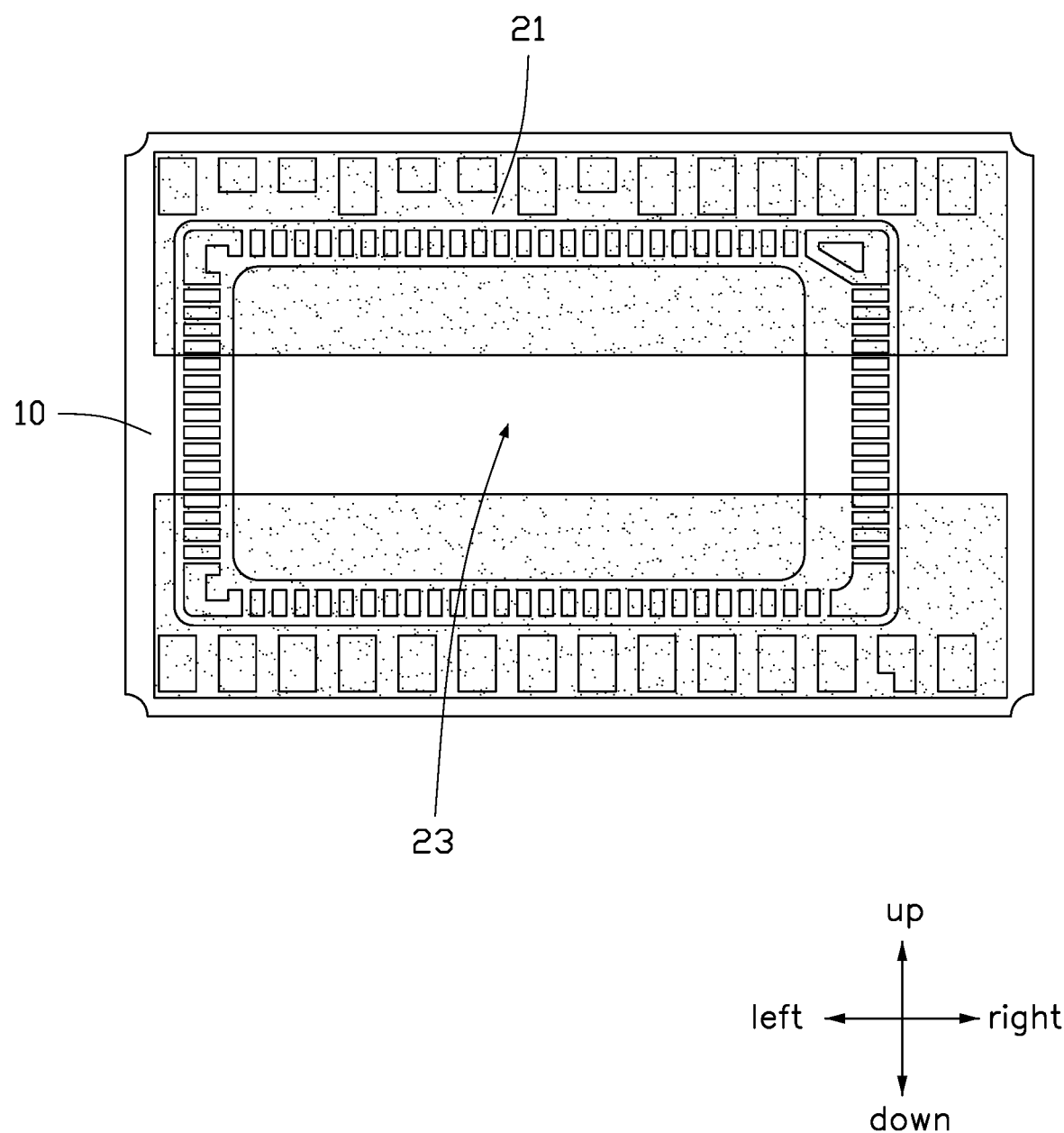
FIG. 3 is a schematic diagram of another embodiment of a camera module.

Referring to FIGS. 2 and 3, the film 20 is attached to the spacers 11 at opposite sides of the substrate 10, and the channel 23 is defined between the film 20 and the receiving cavity 12. It should be noted that the film 20 is a conductive film. In one embodiment, the film 20 is an anisotropic conductive film, but the film 20 is not limited thereto.

When the camera module 100 is in a high temperature, high pressure, or other harsh environment, the substrate 10 generates gas, and the generated gas is discharged from the receiving cavity 12 through the channel 23. It should be noted that there are many ways to define the channel 23, as described below.

Figure 4:
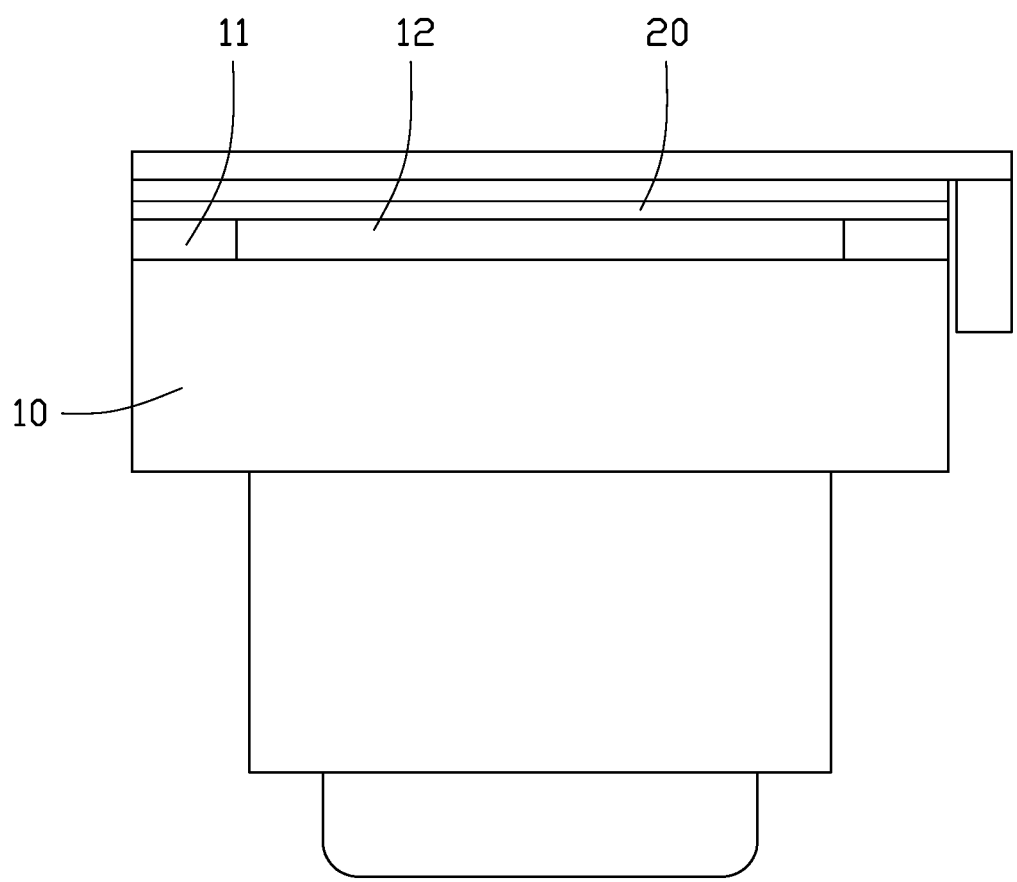
FIG. 4 is a schematic structural diagram of the camera module shown in FIG. 2.

Referring to FIG. 2, in one embodiment, the film 20 includes a fixing portion 21 and a communicating portion 22. The fixing portion 21 is attached to the spacers 11. The communicating portion 22 deviates from an edge of the substrate 10, such that a lower edge of the communicating portion 22 is higher than a lower edge of the receiving cavity 12, so that the channel 23 is defined between the film 20 and the receiving cavity 12 to communicate the receiving cavity 12 to the outside environment, as shown in FIG. 4.

A distance between the communicating portion 22 and the edge of the substrate 10 ranges from 20 um to 160 um.

Figure 5:
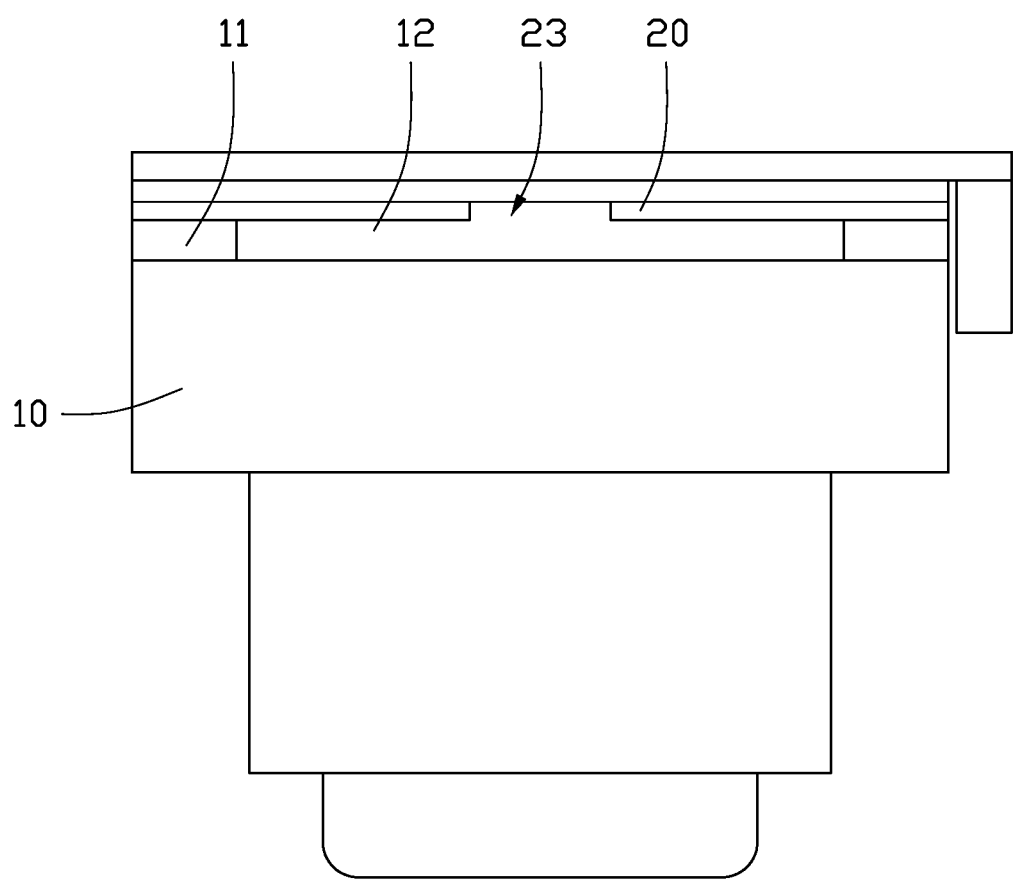
FIG. 5 is a schematic structural diagram of the camera module shown in FIG. 3.

Referring to FIG. 3, in another embodiment, there are two films 20. One end of each film 20 is attached to the spacers 11 of one side of the substrate 10, and another end of the film 20 extends a predetermined distance away from the spacers 11 toward the other film 20. The channel 23 communicating with the receiving cavity 12 is defined between the two films 20 to communicate the receiving cavity 12 to the outside environment, as shown in FIG. 5.

Figure 6:
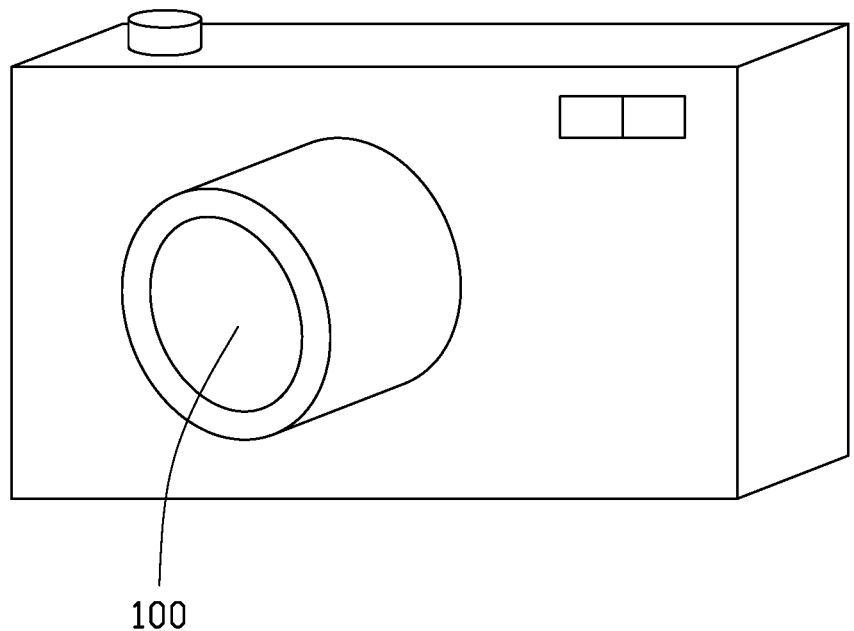
FIG. 6 is a schematic diagram of an electronic device.

Referring to FIG. 6, the present application further provides an electronic device 200 including the above-mentioned camera module 100. The electronic device 200 may be, but is not limited to, a video camera, a mobile phone, a tablet computer, a notebook computer, and the like.

In the camera module 100, the film 20 is attached to the spacers 11 and contacts the sensors 15 to transmit the external light signal detected by the sensors 15.

The channel 23 is defined between two films 20 or between the film 20 and the substrate 10. When the substrate 10 generates gas, the gas generated by the substrate 10 is discharged from the substrate 10 through the receiving cavity 12 and the channel 23. The camera module 100 defining the channel 23 communicating with the receiving cavity 12 has a low manufacturing cost, and reliability of the electronic device 200 using the camera module 100 is improved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A camera module comprising:
a substrate defining a receiving cavity, the receiving cavity comprising an inner wall and a bottom portion surrounding the inner wall, and the bottom portion defining an opening;
a plurality of sensors mounted on the bottom portion in the receiving cavity and around the opening; and
at least one film attached to the substrate and covering the receiving cavity; wherein:
the camera module defines a channel communicating with the receiving cavity to allow gas in the receiving cavity to be discharged toward the film.

2. The camera module of claim 1, wherein:
the channel is defined by the at least one film.

3. The camera module of claim 1, wherein:
the channel is defined between the at least one film and the substrate.

4. The camera module of claim 3, wherein:
the at least one film comprises a fixing portion and a communicating portion;
the fixing portion is attached to opposite sides of the substrate; and
the communicating portion deviates from an edge of the substrate and a lower edge of the communicating portion is higher than a lower edge of the receiving cavity, so that the channel communicates with the receiving cavity.

5. The camera module of claim 4, wherein:
a distance between the communicating portion and the edge of the substrate ranges from 20 um to 160 um.

6. The camera module of claim 2, wherein:
a number of the at least one film is two;
the two films are respectively attached to opposite sides of the substrate; and
the channel communicating with the receiving cavity is defined between the two films.

7. The camera module of claim 1, wherein:
the substrate comprises a plurality of spacers arranged on opposite sides of the substrate; and
the at least one film is attached to the plurality of spacers.

8. The camera module of claim 1, wherein:
the plurality of sensors is uniformly arranged around the bottom portion.

9. The camera module of claim 1, wherein:
the plurality of sensors is randomly arranged around the bottom portion.

10. An electronic device comprising a camera module, the camera module comprising:
a substrate defining a receiving cavity, the receiving cavity comprising an inner wall and a bottom portion surrounding the inner wall, and the bottom portion defining an opening;
a plurality of sensors mounted on the bottom portion in the receiving cavity and around the opening; and
at least one film attached to the substrate and covering the receiving cavity; wherein:
the camera module defines a channel communicating with the receiving cavity to allow gas in the receiving cavity to be discharged toward the film.

11. The electronic device of claim 10, wherein:
the channel is defined by the at least one film.

12. The electronic device of claim 10, wherein:
the channel is defined between the at least one film and the substrate.

13. The electronic device of claim 12, wherein:
the at least one film comprises a fixing portion and a communicating portion;
the fixing portion is attached to opposite sides of the substrate; and
the communicating portion deviates from an edge of the substrate and a lower edge of the communicating portion is higher than a lower edge of the receiving cavity, so that the channel communicates with the receiving cavity.

14. The electronic device of claim 13, wherein:
a distance between the communicating portion and the edge of the substrate ranges from 20 um to 160 um.

15. The electronic device of claim 11, wherein:
a number of the at least one film is two;
the two films are respectively attached to opposite sides of the substrate; and
the channel communicating with the receiving cavity is defined between the two films.

16. The electronic device of claim 10, wherein:
the substrate comprises a plurality of spacers arranged on opposite sides of the substrate; and
the at least one film is attached to the plurality of spacers.

17. The electronic device of claim 10, wherein:
the plurality of sensors is uniformly arranged around the bottom portion.

18. The electronic device of claim 10, wherein:
the plurality of sensors is randomly arranged around the bottom portion.

* * * * *